United States Patent
Pool et al.

(10) Patent No.: US 7,420,769 B2
(45) Date of Patent: Sep. 2, 2008

(54) DATA STORAGE DEVICE ENCLOSURE WITH OVERMOLDED CONNECTOR TO PROVIDE CONDUCTIVE LEAD SUPPORT

(75) Inventors: Jess B. Pool, Lakeville, MN (US); David Allsup, Lakeville, MN (US); Curtis Trammell, Newcastle, OK (US)

(73) Assignee: Seagate Technology LLC, Scotts Valley, CA (US)

( * ) Notice: Subject to any disclaimer, the term of this patent is extended or adjusted under 35 U.S.C. 154(b) by 381 days.

(21) Appl. No.: 10/823,224

(22) Filed: Apr. 13, 2004

(65) Prior Publication Data

US 2005/0225894 A1    Oct. 13, 2005

(51) Int. Cl.
G11B 33/00 (2006.01)
G11B 25/04 (2006.01)

(52) U.S. Cl. ................... 360/97.01; 29/603.03

(58) Field of Classification Search ............... 360/97.01, 360/97.02, 97.03, 98.01; 29/603.03
See application file for complete search history.

(56) References Cited

U.S. PATENT DOCUMENTS

| | | | |
|---|---|---|---|
| 5,227,936 A * | 7/1993 | Strickler et al. | 360/97.02 |
| 5,420,733 A | 5/1995 | Knighton et al. | |
| 5,454,157 A | 10/1995 | Ananth et al. | |
| 5,500,779 A * | 3/1996 | Diel | 360/97.01 |
| 5,991,165 A * | 11/1999 | Jones et al. | 361/816 |
| 6,108,162 A | 8/2000 | Amirkiai et al. | |
| 6,219,909 B1* | 4/2001 | Ogawa et al. | 360/97.01 |
| 6,270,375 B1 | 8/2001 | Cox et al. | |
| 6,430,000 B1* | 8/2002 | Rent | 360/97.03 |
| 6,454,572 B1 | 9/2002 | Konetski et al. | |
| 6,567,235 B2 | 5/2003 | Kasetty et al. | |
| 6,597,531 B2 | 7/2003 | Noda | |
| 2002/0141107 A1* | 10/2002 | Kasetty et al. | 360/97.01 |
| 2003/0016468 A1* | 1/2003 | Hayakawa et al. | 360/97.01 |

* cited by examiner

*Primary Examiner*—Craig A Renner
(74) *Attorney, Agent, or Firm*—Fellers, Snider, et al.

(57) ABSTRACT

A storage apparatus that electrically connects to a central processor unit includes an enclosure having a surface and a printed circuit board. The printed circuit board is fixedly coupled to the surface of the enclosure and configured to operate the storage apparatus. The printed circuit board has a plurality of contact pads. The storage apparatus also includes an electrical connector having a plurality of conductive pins electrically coupled to the plurality of contact pads. An overmold section couples the electrical connector to the surface of the enclosure.

18 Claims, 6 Drawing Sheets

DATA STORAGE DEVICE ENCLOSURE WITH OVERMOLDED CONNECTOR TO PROVIDE CONDUCTIVE LEAD SUPPORT

FIELD OF THE INVENTION

The present invention relates generally to data storage systems. In particular, the present invention relates to an electrical connector which electrically connects a central processor unit to a data storage system.

BACKGROUND OF THE INVENTION

Computer equipment has become extremely popular for a wide variety of home, business and commercial uses. Such computer equipment commonly includes a central processor unit having one or more data storage systems. A typical data storage system includes a rigid housing having a basedeck and top cover that encloses a variety of components.

Often, a printed circuit board (PCB) is mounted directly to a data storage housing to operate the data storage system. An electrical connector is typically attached to the PCB prior to assembling the PCB to the data storage housing by coupling contact leads of the electrical connector to contact pads of the PCB with a solder joint. The electrical connector provides an electronic interface between the data storage system and the central processor unit. The electrical connector is coupled to a mating connector of the central processor unit and is typically of a standard configuration. For example, the electrical connector can be a small computer system interface (SCSI) connector.

Vibration or shock events to the data storage system can cause sliding between contacts of the drive electrical connector and contacts of its mating connector. Sliding contacts can cause intermittent changes in electrical resistance, which affect high-speed digital data transmission. The data storage system can also experience motion during disc drive seek mode causing misalignment between the disc drive housing and its electrical connector.

SUMMARY OF THE INVENTION

A storage apparatus that electrically connects to a central processor unit includes an enclosure having a surface and a printed circuit board. The printed circuit board is fixedly coupled to the surface of the enclosure and configured to operate the storage apparatus. The printed circuit board has a plurality of contact pads. An electrical connector having a plurality of conductive pins is configured to electrically couple to the contact pads. An overmold section couples the electrical connector to the surface of the enclosure.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
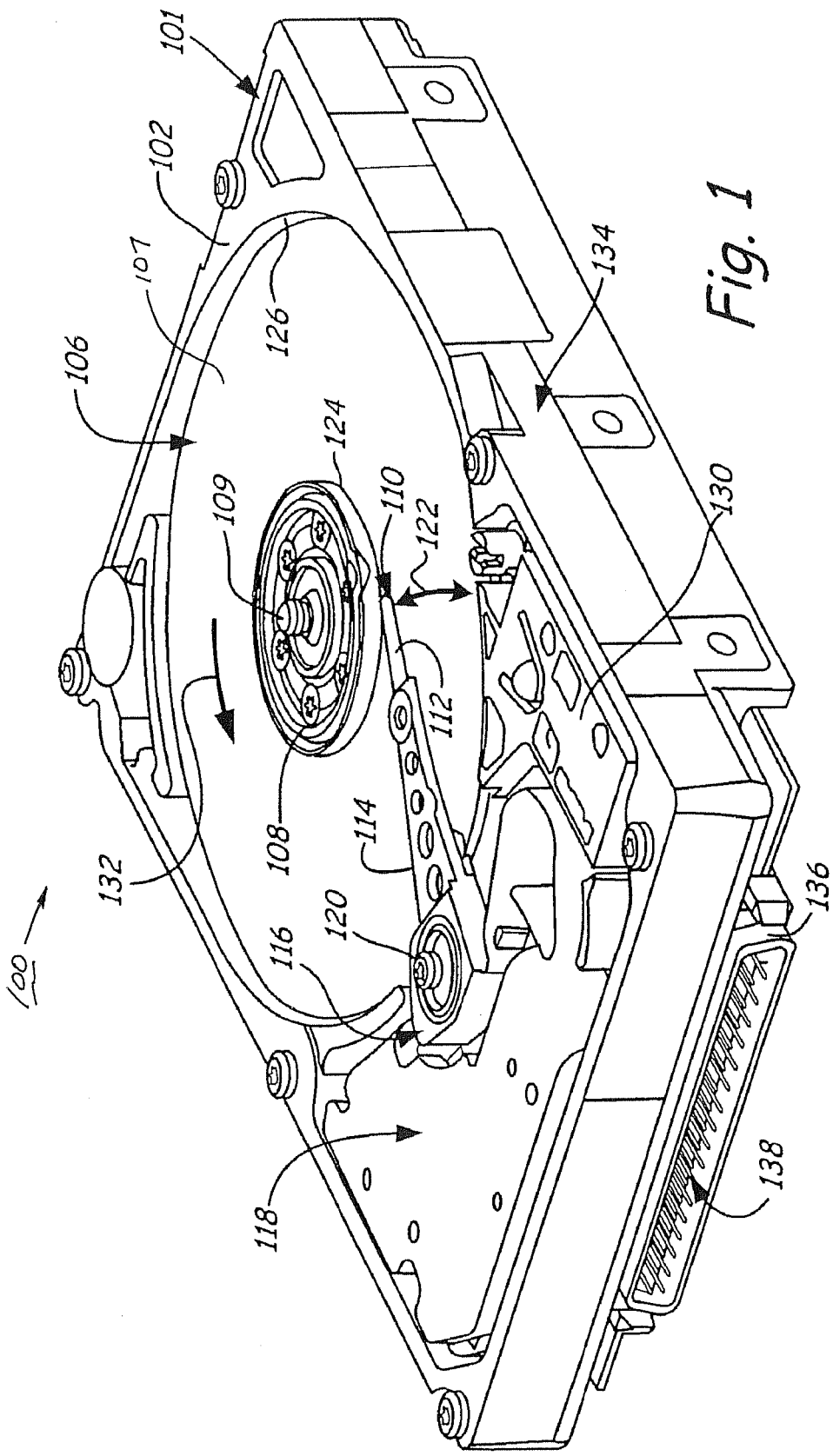
FIG. 1 is a top perspective view of a disc drive.

FIG. 1 is a top perspective view of data storage system 100 in which embodiments of the present invention are useful. Data storage systems are common disc drives. Disc drive 100 includes an enclosure 101 having a basedeck 102 and a top cover (not shown). Enclosure 101 includes an outer surface 134. Disc drive 100 further includes a disc pack 106, which is mounted on a spindle motor (not shown) by a disc clamp 108. Disc pack 106 includes a plurality of individual discs 107, which are mounted for co-rotation about central axis 109. Each disc surface has an associated slider 110, which carries a read/write head for communication with the surface on each disc 107.

Each slider 110 is supported by a suspension 112 which is in turn attached to a track accessing arm 114 of an actuator mechanism 116. Actuator mechanism 116 is rotated about a shaft 120 by a voice coil motor 118, which is controlled by servo control circuitry within internal circuit 130. As voice coil motor 118 rotates actuator mechanism 116, slider 110 moves in an arcuate path 122 between a disc inner diameter 124 and a disc outer diameter 126.

During operation, as discs 107 rotate in a rotational direction 132, the discs 107 drag air under the respective sliders 110 and along their air bearing surfaces. As the air passes beneath the air bearing surfaces, air compression along the airflow path causes the air pressure between the discs 107 and the air bearing surfaces to increase, which creates an aerodynamic lifting force that counteracts the load force provided by actuator mechanism 116 and causes the sliders 110 to lift and fly above, but in close proximity to the disc surfaces. While FIG. 1 illustrates one manner of actuating a data head proximate a data storage medium, the present invention, however, is applicable to data storage systems that use other techniques.

FIG. 1 also illustrates electrical connector 136. Electrical connector 136 provides an electronic interface between disc drive 100 and a central processor unit (not shown). Electrical connector 136 is an input/output connector that includes a plurality of conductive pins 138 which are configured to electrically connect with a female connector of a central processor unit. Electrical connector 136 can be of any standard configuration. For example, electrical connector 136 is a standard SCSI connector.

Figure 2:
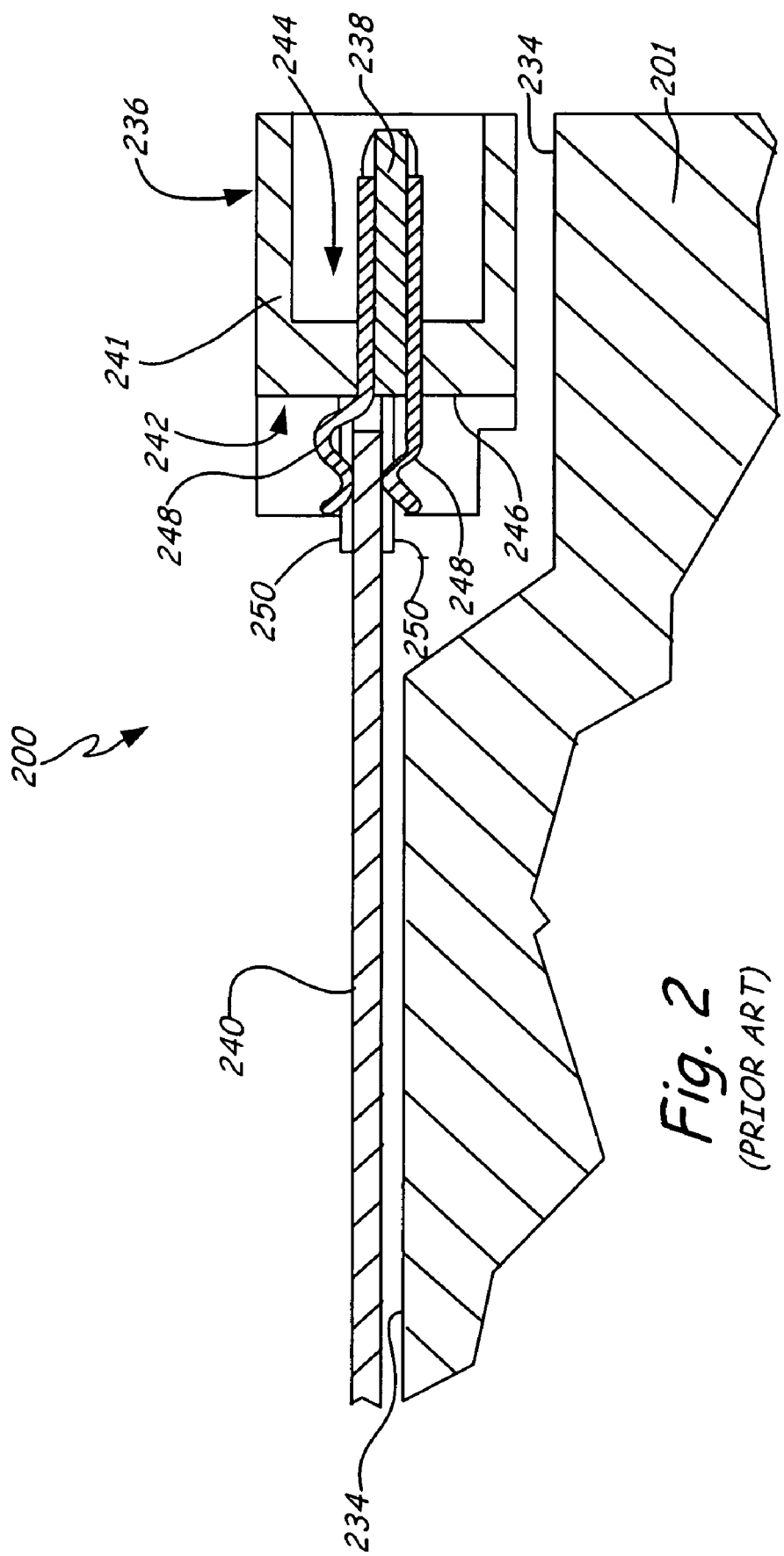
FIG. 2 is an enlarged section view of a disc drive in accordance with the prior art.

FIG. 2 is an enlarged section view of a disc drive 200 in accordance with the prior art. Disc drive 200 includes an enclosure 201, an electrical connector 236 and a printed circuit board (PCB) 240. Electrical connector 236 includes a non-conductive electrical housing 241 that has an inboard side 242, an opposing outboard side 244 and a pin supporting wall 246 that extends the width of housing 241. A plurality of conductive pins 238 (FIG. 2 illustrates the cross-section of one pin) extend generally perpendicular from outboard side 244 of pin supporting wall 246 and are configured to electrically couple to a mating connector (not shown) of a central processor unit (not shown). A plurality of connector lead pairs 248 (FIG. 2 illustrates the cross-section of one pair of pins) extend from inboard side 242 of pin supporting wall 246. Each conductive pin 238 corresponds with each connector lead pair 248 that extends through pin supporting wall 246. PCB 240 includes a plurality of contact pads 250. Each connector lead 248 of electrical connector 236 is electrically coupled to each contact pad 250 by a solder joint (not shown).

Generally, after electrical connector 236 is electrically coupled to PCB 240, PCB 240 is directly mounted to outer surface 234 of enclosure 201 to operate disc drive 200.

Disc drive 200 can experience vibration or shock events that cause undesirable sliding between conductive pins 238 and its corresponding female connector. Sliding contacts can cause intermittent changes in electrical resistance which detrimentally affect high-speed digital data transmission. Other miscellaneous motion of disc drive 200, such as motion during seek mode, can cause misalignment between enclosure 201 and electrical connector 236. To avoid sliding contacts, it is desirable to provide better retention of disc drive 200. In addition, it is desirable to improve the alignment tolerance of electrical connector 236 relative to enclosure 201. During assembly of disc drive 200, connector 236 is coupled to PCB 240 and then PCB 240 is mounted to disc drive 200 with screws. This method assembly can cause connectors to be placed out of alignment relative to disc drive 200. Thus when the disc drive 200 is inserted into a cabinet in a central processing unit, the cabinet can deflect the connector 236.

In some circumstances, applying a sustained force or load to electrical connector 236 provides better retention of disc drive 200. However, applying a sustained load to electrical connector 236 will not improve its alignment. In addition, electrical connector 236 is coupled to PCB 240 with solder joints which can have the tendency to creep under sustained loads. Cracking or breaking of solder joints can result in disc drive failure. Thus, the present invention provides an electrical connector overmolded to the enclosure of the disc drive such that the electrical connector has high structural rigidity to withstand a sustained load without compromising the electrical connection. The present invention also provides high precision connector alignment.

Figure 3:
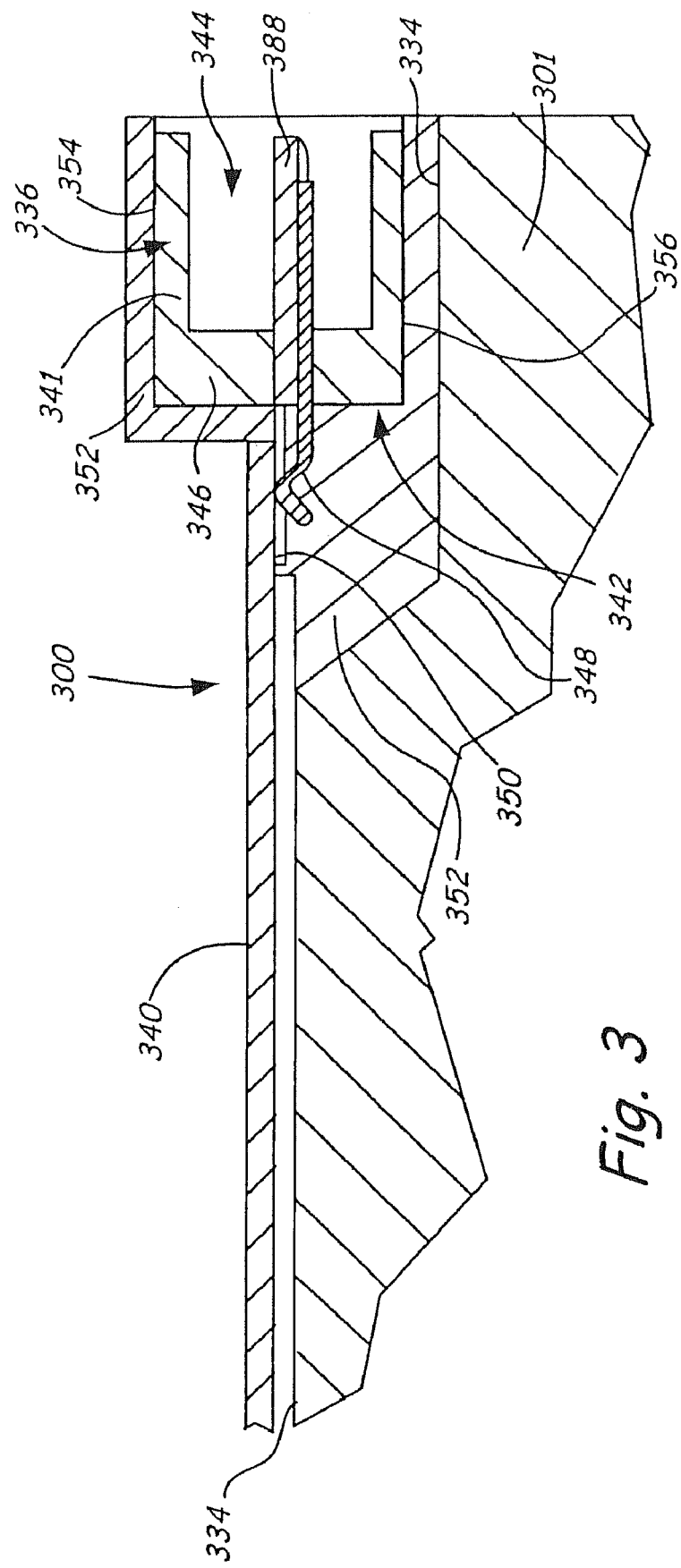
FIG. 3 is an enlarged section view of a disc drive in accordance with embodiments of the present invention.

FIG. 3 is an enlarged section view of disc drive 300 in accordance with an embodiment of the present invention. Disc drive 300 includes enclosure 301, electrical connector 336 and PCB 340. Electrical connector 336 includes non-conductive connector housing 341 that has an inboard side 342, an opposing outboard side 344 and pin supporting wall 346 that extends the width of housing 341. A plurality of conductive pins 388 extend generally perpendicular from outboard side 344 of pin supporting wall 346 and are configured to electrically couple to a mating connector (not shown) of a central processing unit (not shown). A plurality of spring-like connector leads 348 extend from inboard side 342 of housing 341. To simplify the manufacturing process, each conductive pin 388 corresponds with a single connector lead 348. On outboard side 344 of connector housing 336 are provided upper and lower pin enclosing walls 354 and 356.

Electrical connector 336 is coupled to outer surface 334 of enclosure 301 by overmold section 352. Overmold section 352 at least partially surrounds connector housing 341 and is positioned adjacent upper pin enclosing wall 354, adjacent pin supporting wall 346 on inboard side 342 and adjacent lower pin enclosing wall 356. Overmold section 352 can be formed through a process of injection overmolding. For example, enclosure 301 and electrical connector 336 are inserted into a mold. A material, such as a plastic, is injected into the mold. The injected material occupies open spaces between electrical connector 336 and the outer surface 334 of enclosure 301 to form overmold section 352. Generally, overmold section 352 comprises a polymer. However, those skilled in the art will recognize that overmold section 352 can comprise other materials with similar properties.

Figure 4:
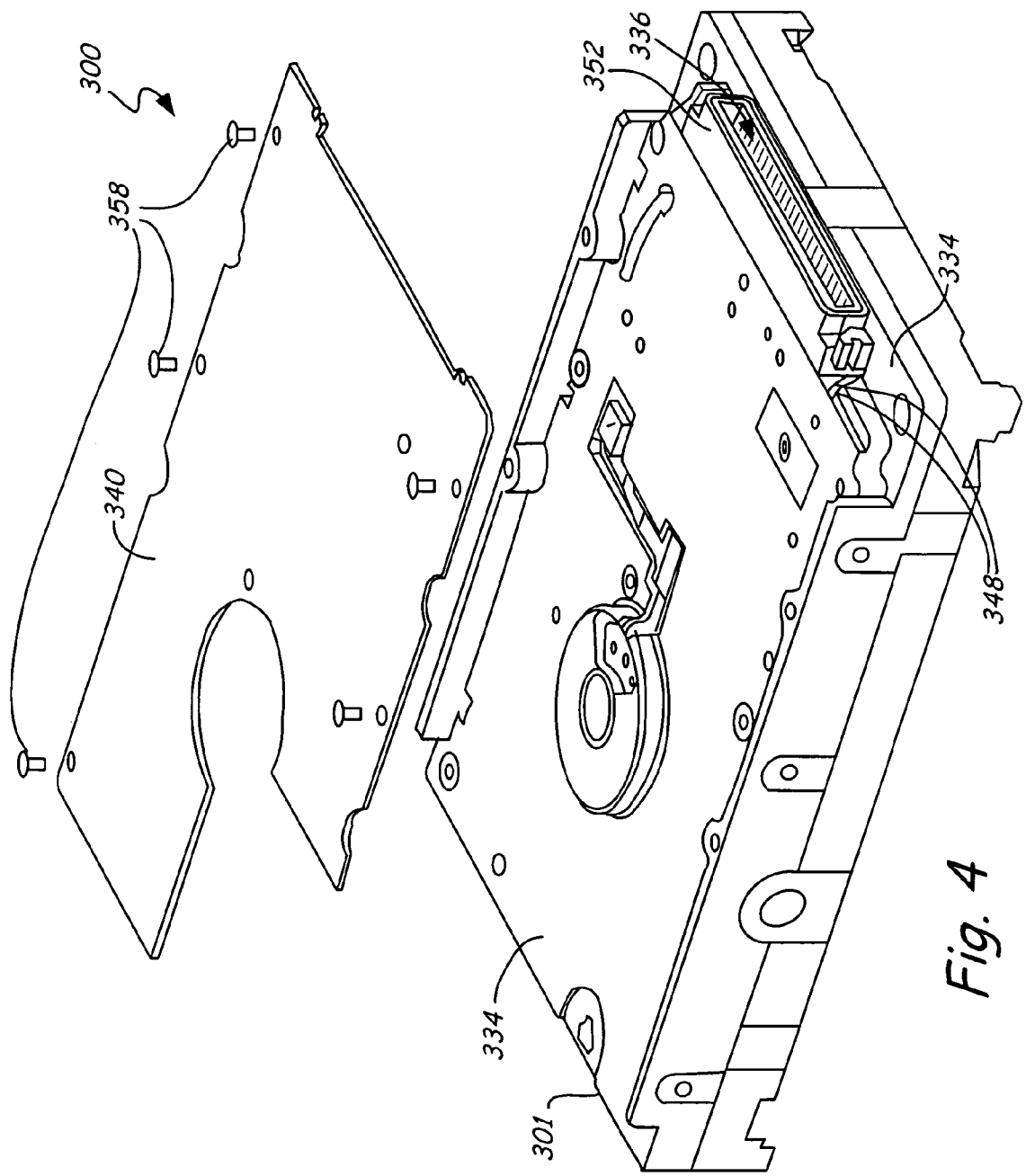
FIG. 4 is a bottom perspective view of the disc drive illustrated in FIG. 3.

FIG. 4 is a bottom perspective view of disc drive 300 in accordance with embodiments of the present invention. Disc drive 300 includes PCB 340, which is configured to operate disc drive 300. FIG. 4 illustrates PCB 340 being directly mounted to outer surface 334 of enclosure 301 by fasteners 358. PCB 340 includes a plurality of contact pads 350 (shown in FIG. 3) that electrically couple with connector leads 348. Upon mounting PCB 340 to enclosure 301, fasteners 358 compress contact pads 350 against the spring-like connector leads 348 of electrical connector 336.

Figure 5:
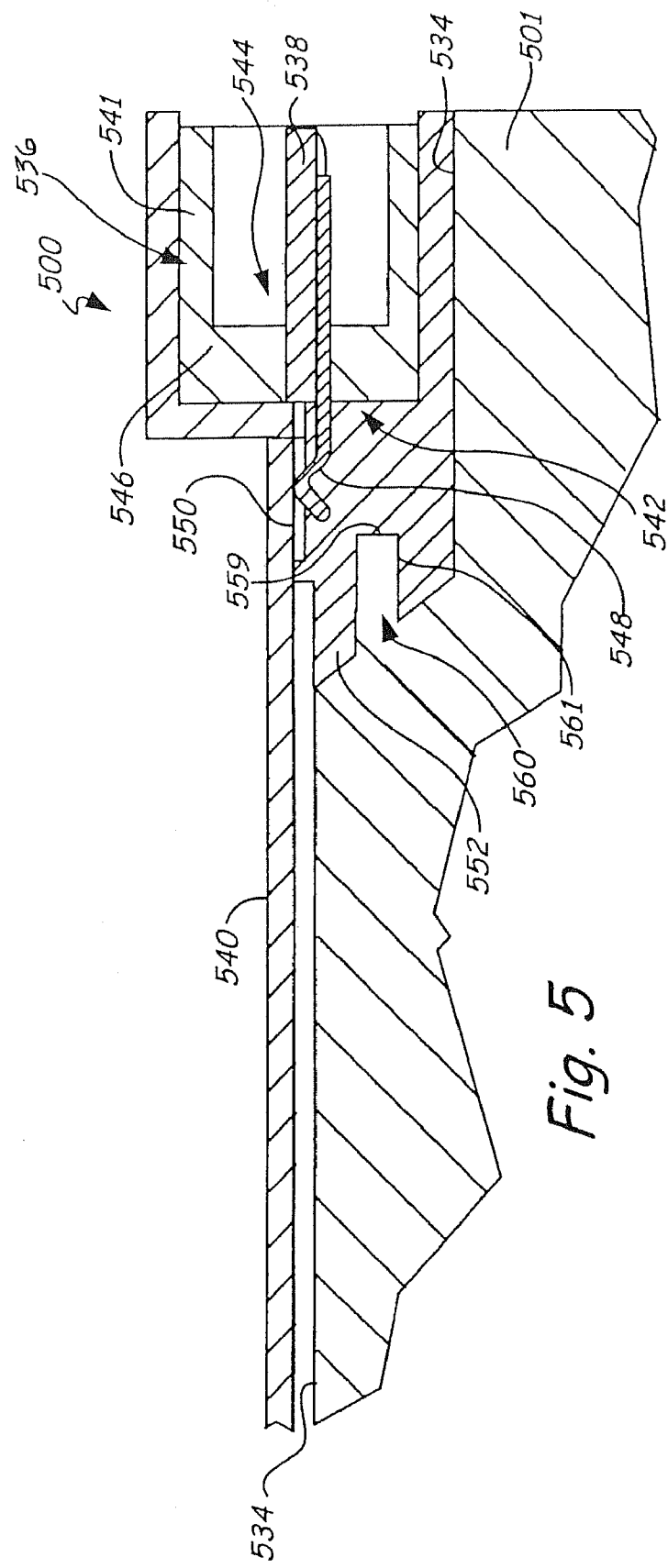
FIG. 5 is an enlarged section view of a disc drive in accordance with embodiments of the present invention.

The compression connection between contact pads 350 of PCB 340 and connector leads 348 is strong enough to eliminate use of solder joints. Thus, the compression connection provides precise alignment of electrical connector 336 and overmold section 352 provides structural rigidity in order for electrical connector 336 to withstand a sustained load FIG. 5 is an enlarged section view of disc drive 500 in accordance with another embodiment of the present invention. Disc drive 500 includes enclosure 501, electrical connector 536 and PCB 540. Electrical connector 536 is similar to electrical connector 336 of FIG. 3 and includes non-conductive connector housing 541 that has an inboard side 542, an opposing outboard side 544 and pin supporting wall 546 that extends the width of housing 541. Electrical conductor 536 has a plurality of conductive pins 538 that extend generally perpendicular from outboard side 544 of pin supporting wall 546 and are configured to electrically couple to a mating connector (not shown) of a central processing unit (not shown). A plurality of spring-like connector leads 548 extend from inboard side 542 of housing 541. Each conductive pin 538 corresponds with each connector lead 548.

Electrical connector 536 is coupled to outer surface 534 of enclosure 501 by overmold section 552 as described in FIG. 3. PCB 540 is fastened to enclosure 501 with fasteners (not shown in FIG. 5) and includes contact pads 550. PCB 540 is configured to operate disc drive 500 and electrically couple to electrical connector 536 through contact pads 550 and connector leads 548. The fasteners compress contact pads 550 of PCB 540 to the spring-like connector leads 548 of electrical connector 536 to form a compression connection void of solder joints.

Although overmold section 552 provides structural rigidity such that electrical connector 536 can withstand a sustained load, overmold section 552 does not necessarily provide a high shear strength. Therefore, enclosure 501 includes at least one external feature 560 which protrudes from outer surface 534 into overmold section 552 and terminates at first end 559. External feature 560 includes side surface 561 and improves the shear strength of electrical connector 536. Those skilled in the art will recognize that external feature 560 can have a variety of different geometrical shapes. For example, in FIG. 5, external feature 560 has a cylindrical shape. External feature 560 can be formed with enclosure 501 during the casting process. Thus, in this example, external feature 560 comprises the same material as enclosure 501. Generally, enclosure 501 is made of aluminum other materials with similar properties.

Figure 6:
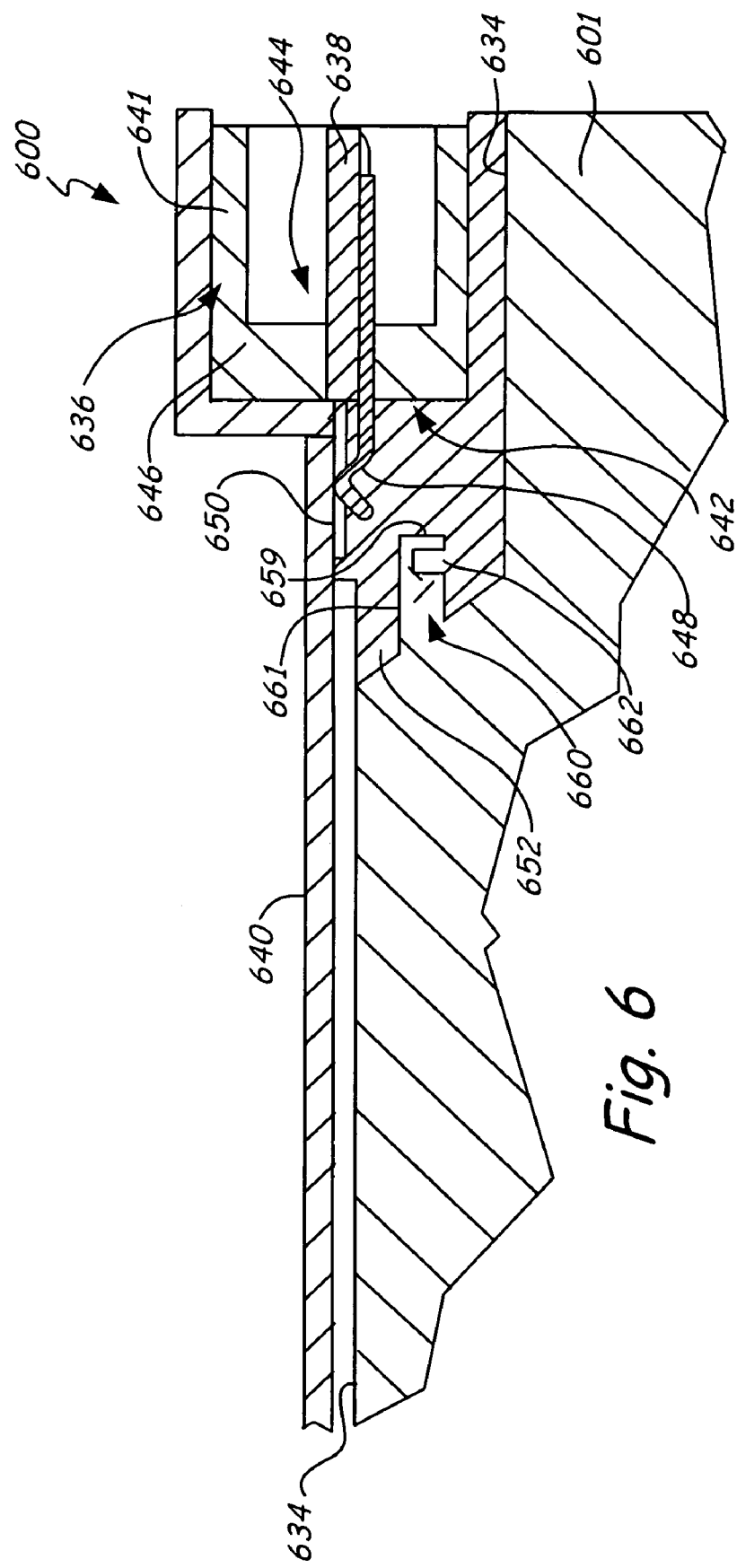
FIG. 6 is an enlarged section view of a disc drive in accordance with embodiments of the present invention.

FIG. 6 is an enlarged section view of disc drive 600 in accordance with another embodiment of the present invention. Disc drive 600 includes enclosure 601, electrical connector 636 and PCB 640. Electrical connector 636 is similar to the electrical connectors discussed in previous embodiments and includes non-conductive connector housing 641 that has an inboard side 642, an opposing outboard side 644 and pin supporting wall 646 that extends the width of housing 641. Electrical conductor 636 has a plurality of conductive pins 638 that extend generally perpendicular from outboard side 644 of pin supporting wall 646 and are configured to electrically couple to a mating connector (not shown) of a central processing unit (not shown). A plurality of spring-like connector leads 648 extend from inboard side 642 of housing 641. Each conductive pin 638 corresponds with each connector lead 648.

Electrical connector 636 is coupled to outer surface 634 of enclosure 601 by overmold section 652 as described in previous embodiments. PCB 640 is fastened to enclosure 601 with fasteners (not shown in FIG. 6) and includes contact pads 650. PCB is configured to operate disc drive 600 and electrically couple to electrical connector 636 through contact pads 650 and connector leads 648. The fasteners of PCB 640 compress contact pads 650 to the spring-like connector leads 648 of electrical connector 636 to form a compression connection void of solder joints. Enclosure 601 includes at least one external feature 660 which protrudes from outer surface 634 of enclosure 601 into overmold section 652 and terminates at first end 659. External feature 660 includes side surface 661.

Although overmold section 652 provides structural rigidity such that electrical connector 536 can withstand a sustained load and external feature 660 provides shear strength, external feature 660 does not necessarily provide high vertical strength. Therefore, external feature 660 also includes at least one notch 662 to improve the vertical strength of electrical connector 636. Notch 662 is located on side surface 661. As shown in FIG. 6, notch 662 is formed on the bottom of side surface 661 of external feature 660. Those skilled in the art will recognize that notch 662 can be located in other areas of external feature 660 as well as formed circumferentially about external feature 660. Notch 662 can be formed with enclosure 601 during the casting process or can be formed by machining the external feature prior to forming overmold section 652.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the apparatus while maintaining substantially the same functionality without departing from the scope and spirit of the present invention. In addition, although the preferred embodiments described herein are directed to a storage apparatus for electrically connecting to a central processor unit, it will be appreciated by those skilled in the art that the teachings of the present invention can be applied to other electrical connections, without departing from the scope and spirit of the present invention.

What is claimed is:

1. An apparatus comprising:
   an enclosure;
   an electrical connector having a housing and a conductive lead extending from the housing to define a spatial separation between the lead and the enclosure;
   an overmold section connecting the housing to the enclosure; and
   a printed circuit board (PCB) fixed to the enclosure to contactingly engage the lead so that the PCB and the lead are electrically coupled, wherein the overmold section is interposed in the spatial separation and contactingly engages the lead at a first location between the housing and where the PCB is electrically coupled with the lead, and the overmold section contactingly engages the lead at a second location between a distal end of the lead and where the PCB is electrically coupled with the lead.

2. The apparatus of claim 1, wherein the overmold section comprises a polymer.

3. The apparatus of claim 1, wherein the electrical connector comprises a plurality of conductive leads that are each electrically coupled to the PCB.

4. The apparatus of claim 3, wherein the housing surrounds a plurality of conductive pins, each pin electrically coupled to a respective one of the plurality of leads, the housing having an upper wall located above the pins, an intermediate wall supporting the pins, and a lower wall located below the pins.

5. The apparatus of claim 4, wherein the overmold section is connected to the upper wall, the lower wall, and the intermediate wall.

6. The apparatus of claim 3, wherein the PCB is fixed to the enclosure with removable fasteners.

7. The apparatus of claim 6, wherein the removable fasteners compressingly engage the PCB against the leads forming a resilient electrical coupling.

8. The apparatus of claim 1, wherein the enclosure comprises a protuberant feature extending into the overmold section.

9. The apparatus of claim 8, wherein the protuberant feature comprises a material that is the same as a material of the enclosure.

10. The apparatus of claim 8, wherein the protuberant feature comprises a cylindrical post.

11. The apparatus of claim 8, wherein the protuberant feature defines a notch.

12. A method comprising:
    placing a connector adjacent an enclosure forming a gap therebetween;
    overmolding a support member in the gap that supports a distal end of a conductive lead of the connector that extends into the gap; and
    attaching a printed circuit board to the enclosure to pressingly engage against the lead with a force acting in opposition to and collinear with a backing force by the support member acting on the lead.

13. An apparatus comprising:
    an enclosure supporting a printed circuit board (PCB); and
    means for coupling conductive leads of an electrical connector to the PCB in a manner providing a backing force to distal ends of the leads that are in operable pressing engagement against the PCB.

14. An apparatus comprising:
    an enclosure; and
    a printed circuit board (PCB) electrically coupled with a connector having a housing attached to the enclosure via an overmold section, wherein the connector has at least one conductive lead extending from the housing that is at least partially embedded in the overmold section so that the overmold section exerts a backing force on the lead in opposition to and collinear to a pressing engagement force of the PCB against the lead creating the electrically coupled relationship between the PCB and the connector.

15. The apparatus of claim 14 wherein the PCB is attached to the enclosure with a removable fastener.

16. The apparatus of claim 14 wherein the electrically coupled relationship is characterized by a solderless electrical coupling.

17. The apparatus of claim 14 wherein the at least one lead comprises a plurality of leads and the overmold section is attached to opposing walls of the housing surrounding a plurality of conductive pins that are electrically coupled to respective ones of the leads.

18. The apparatus of claim 14 wherein the enclosure defines a protuberant feature that is embedded in the overmold section.

* * * * *